United States Patent
Chen et al.

(10) Patent No.: US 11,342,352 B2
(45) Date of Patent: May 24, 2022

(54) THREE-DIMENSIONAL MEMORY DEVICES AND FABRICATING METHODS THEREOF

(71) Applicant: Yangtze Memory Technologies Co., Ltd., Hubei (CN)

(72) Inventors: Liang Chen, Hubei (CN); Lei Xue, Hubei (CN); Wei Liu, Hubei (CN); Shi Qi Huang, Hubei (CN)

(73) Assignee: Yangtze Memory Technologies Co., Ltd., Hubei (CN)

( * ) Notice: Subject to any disclaimer, the term of this patent is extended or adjusted under 35 U.S.C. 154(b) by 134 days.

(21) Appl. No.: 16/729,861

(22) Filed: Dec. 30, 2019

(65) Prior Publication Data
US 2021/0035888 A1    Feb. 4, 2021

Related U.S. Application Data

(63) Continuation of application No. PCT/CN2019/099028, filed on Aug. 2, 2019.

(51) Int. Cl.
*H01L 27/11582* (2017.01)
*H01L 23/48* (2006.01)
(Continued)

(52) U.S. Cl.
CPC ...... *H01L 27/11582* (2013.01); *H01L 23/481* (2013.01); *H01L 27/1024* (2013.01);
(Continued)

(58) Field of Classification Search
None
See application file for complete search history.

(56) References Cited

U.S. PATENT DOCUMENTS

| 7,041,545 B2 | 5/2006 | Wilier |
| 9,431,415 B2 | 8/2016 | Shin et al. |

(Continued)

FOREIGN PATENT DOCUMENTS

| CN | 107482015 A | 12/2017 |
| CN | 109075190 A | 12/2018 |

(Continued)

OTHER PUBLICATIONS

International Search Report and Written Opinion of the International Searching Authority directed to related International Patent Application No. PCT/CN2019/099028, dated Apr. 24, 2020; 8 pages.

*Primary Examiner* — Anthony Ho
*Assistant Examiner* — Kevin Quinto
(74) *Attorney, Agent, or Firm* — Sterne, Kessler, Goldstein & Fox P.L.L.C.

(57) ABSTRACT

A method for forming a gate structure of a 3D memory device is provided. The method comprises forming an array wafer including a periphery region and a staircase and array region. A process of forming the array wafer comprises forming an array well structure in a first substrate in the periphery region, forming an array device on the first substrate in the staircase and array region, and forming at least one vertical through contact in the periphery region and in contact with the array well structure. The method further comprises forming a CMOS wafer, and bonding the array wafer and the CMOS wafer. The method further comprises forming at least one through substrate contact penetrating the first substrate and the array well structure, and in contact with the at least one vertical through contact.

20 Claims, 12 Drawing Sheets

(51) Int. Cl.
  *H01L 27/102*  (2006.01)
  *H01L 27/11524*  (2017.01)
  *H01L 27/11529*  (2017.01)
  *H01L 27/11531*  (2017.01)
  *H01L 27/11556*  (2017.01)
  *H01L 27/1157*  (2017.01)
  *H01L 27/11573*  (2017.01)
(52) U.S. Cl.
  CPC .... *H01L 27/1157* (2013.01); *H01L 27/11524* (2013.01); *H01L 27/11529* (2013.01); *H01L 27/11531* (2013.01); *H01L 27/11556* (2013.01); *H01L 27/11573* (2013.01)

(56) References Cited

U.S. PATENT DOCUMENTS

| | | | |
|---|---|---|---|
| 10,249,640 B2 | 4/2019 | Yu et al. | |
| 10,283,493 B1 | 5/2019 | Nishida | |
| 10,665,580 B1 * | 5/2020 | Hosoda | H01L 27/11582 |
| 2006/0249783 A1 * | 11/2006 | Lojek | H01L 29/7881 |
| | | | 257/327 |
| 2016/0163732 A1 | 6/2016 | Lim et al. | |
| 2020/0006371 A1 | 1/2020 | Huo et al. | |
| 2020/0058669 A1 | 2/2020 | Chen et al. | |

FOREIGN PATENT DOCUMENTS

| | | |
|---|---|---|
| CN | 109155320 A | 1/2019 |
| CN | 109192734 A | 1/2019 |
| CN | 109564923 A | 4/2019 |

\* cited by examiner

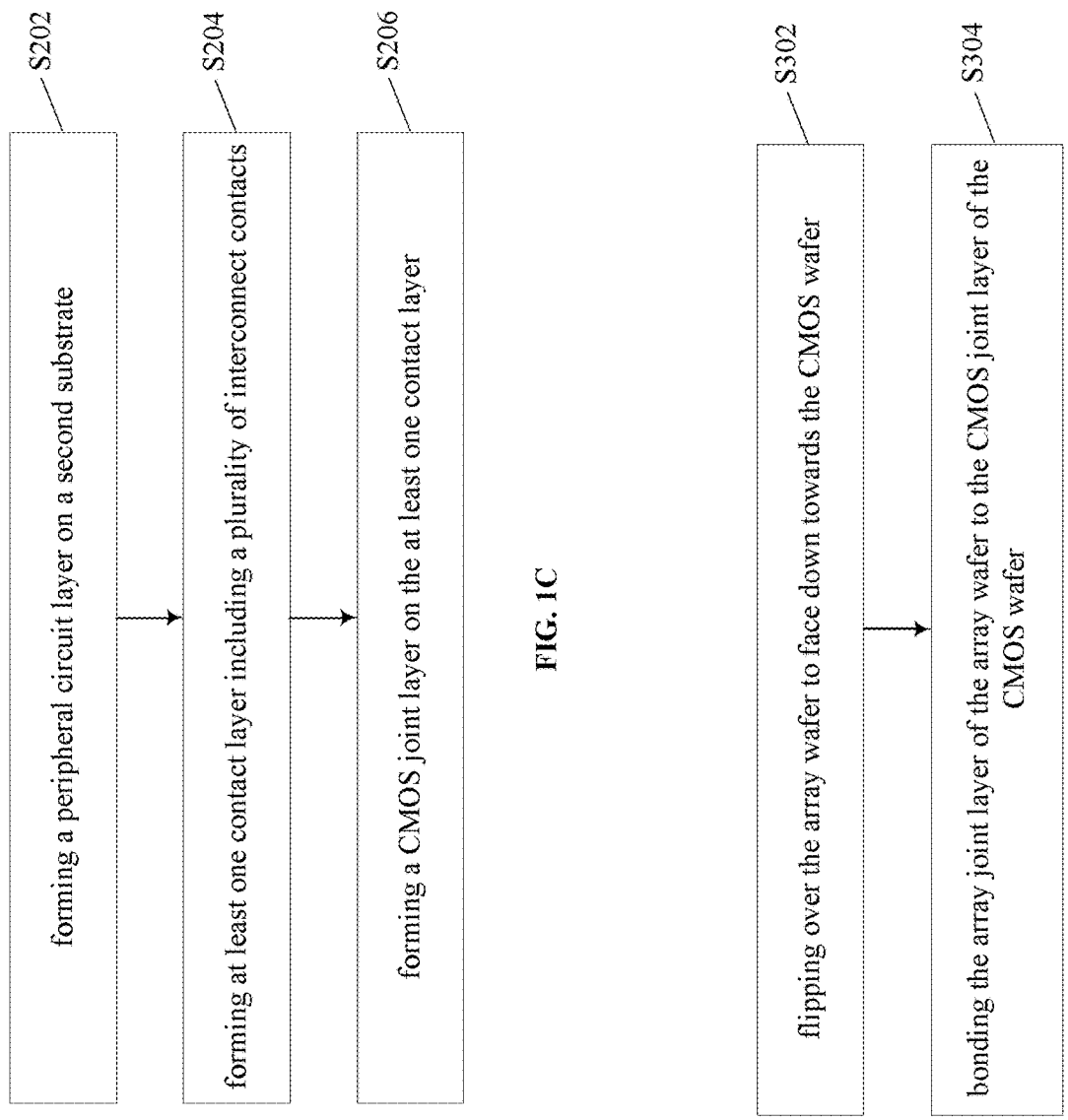

THREE-DIMENSIONAL MEMORY DEVICES AND FABRICATING METHODS THEREOF

CROSS-REFERENCE TO RELATED APPLICATIONS

This application claims priority to PCT Application No. PCT/CN2019/099028, filed on Aug. 2, 2019, which is incorporated herein by reference in its entirety.

BACKGROUND

Embodiments of the present disclosure relate to three-dimensional (3D) memory devices and fabrication methods thereof.

Planar memory cells are scaled to smaller sizes by improving process technology, circuit designs, programming algorithms, and fabrication processes. However, as feature sizes of the memory cells approach a lower limit, planar processes and fabrication techniques become challenging and costly. As a result, memory density for planar memory cells approaches an upper limit.

A 3D memory architecture can address the upper density limitation in planar memory cells. The 3D memory architecture includes a memory array and peripheral devices for controlling signals to and from the memory array.

BRIEF SUMMARY

Embodiments of method for forming gate structures of 3D memory devices and fabrication methods thereof are disclosed herein.

Disclosed is a method for forming a three-dimensional (3D) NAND memory device, comprising forming an array wafer including a periphery region and a staircase and array region, comprising: forming an array well structure in a first substrate in the periphery region, forming an array device on the first substrate in the staircase and array region, and forming at least one vertical through contact in the periphery region and in contact with the array well structure. The method can further comprise: forming a CMOS wafer; bonding the array wafer and the CMOS wafer; and forming at least one through substrate contact penetrating the first substrate and the array well structure, and in contact with the at least one vertical through contact.

In some embodiments, forming the array well structure comprises: forming a bipolar junction transistor in the first substrate in the periphery region; wherein the bipolar junction transistor includes a n-well region sandwiched by two p-well regions.

In some embodiments, forming the array well structure comprises: forming a bipolar junction transistor in the first substrate in the periphery region; wherein the bipolar junction transistor includes a p-well region sandwiched by two n-well regions.

In some embodiments, forming the array device comprises: forming an alternating conductor/dielectric stack on the first substrate; forming a plurality of NAND strings vertically penetrating the alternating conductor/dielectric stack; and forming a staircase structure on at least one lateral side of the alternating conductor/dielectric stack.

In some embodiments, forming the array wafer further comprises: forming an insulating layer covering the array well structure and the array device; and forming at least one word line contact in the staircase and array region and in contact with a word line in the staircase structure; wherein the at least one vertical through contact and the at least one word line contact are simultaneously formed in the insulating layer by a same contact forming process.

In some embodiments, forming the array wafer further comprises: forming at least one first contact layer including a plurality of first interconnect contacts on the insulating layer; and forming an array joint layer on the at least one first contact layer.

In some embodiments, forming the CMOS wafer comprises: forming a peripheral circuit layer on a second substrate; forming at least one second contact layer including a plurality of second interconnect contacts on the peripheral circuit layer; and forming a CMOS joint layer on the at least one second contact layer.

In some embodiments, bonding the array wafer to the CMOS wafer comprises: flipping over the array wafer to face down towards the CMOS wafer; and bonding the array joint layer of the array wafer to the CMOS joint layer of the CMOS wafer, such that the at least one vertical through contact is electrically connected to the peripheral circuit layer through at least one first interconnect contact and at least one second interconnect contact.

In some embodiments, forming the at least one through substrate contact comprises: forming at least one through substrate opening penetrating the first substrate; and forming an isolating layer covering the first substrate and filling the at least one through substrate opening; forming at least one vertical through opening that penetrates the isolating layer, the at least one through substrate opening, and the array well structure, and exposes at least a portion of the at least one vertical through contact; and forming the at least one through substrate contact in the at least one vertical through opening, such that the at least one through substrate contact is in contact with the at least one vertical contact.

In some embodiments, forming at least one through substrate opening comprises: using a deep plasma etching to form the at least one through substrate opening in the first substrate; wherein a high-energy stream of plasma during the deep plasma etching is blocked by the array well structure.

In some embodiments, forming the at least one through substrate contact further comprises: forming at least one array pad in contact with the least one through substrate contact; and forming at least one pad opening to expose the at least one array pad.

The disclosed three-dimensional (3D) memory device can comprises an array wafer including a periphery region and a staircase and array region, comprising: a first substrate, an array well structure in the first substrate in the periphery region, an array device on the first substrate in the staircase and array region, at least one vertical through contact in the periphery region; and at least one through substrate contact penetrating the first substrate and the array well structure, and in contact with the at least one vertical through contact. The 3D memory device can further comprise a CMOS wafer bonded on the array wafer, comprising a peripheral circuit layer electrically connected to the at least one through substrate contact through the at least one vertical through contact.

In some embodiments, the array well structure comprises a bipolar junction transistor including a p-well region sandwiched by two n-well regions in the first substrate.

In some embodiments, the array well structure comprises a bipolar junction transistor including a n-well region sandwiched by two p-well regions in the first substrate.

In some embodiments, the array device comprises: an alternating conductor/dielectric stack on the first substrate; a plurality of NAND strings vertically penetrating the alternating conductor/dielectric stack; and a staircase structure on at least one lateral side of the alternating conductor/dielectric stack.

In some embodiments, the array wafer further comprises: an insulating layer covering the array well structure and the array device; at least one word line contact in the staircase and array region and in contact with a word line in the staircase structure; wherein the at least one vertical through contact and the at least one word line contact penetrate the insulating layer.

In some embodiments, the array wafer further comprises: at least one first contact layer including a plurality of first interconnect contacts covering the insulating layer; and an array joint layer between the at least one first contact layer and the CMOS wafer.

In some embodiments, the CMOS wafer comprises: a peripheral circuit layer on a second substrate; at least one second contact layer including a plurality of second interconnect contacts on the peripheral circuit layer; and a CMOS joint layer between the at least one second contact layer and the array joint layer.

In some embodiments, the array wafer further comprises: an isolating layer covering the first substrate; wherein the at least one through substrate contact penetrates the isolating layer and the array well structure, and in contact with the at least one vertical contact.

In some embodiments, the array wafer further comprises: at least one array pad in contact with the least one through substrate contact; wherein the at least one array pad is electrically connected to the peripheral circuit layer of the CMOS wafer through the at least one vertical through contact, the at least one first interconnect contact, and the at least one second interconnect contact.

Other aspects of the present disclosure can be understood by those skilled in the art in light of the description, the claims, and the drawings of the present disclosure.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

FIGS. 1A-1E illustrate flow diagrams of an exemplary method for forming a 3D memory device, according to some embodiments of the present disclosure.

Figure 1A:
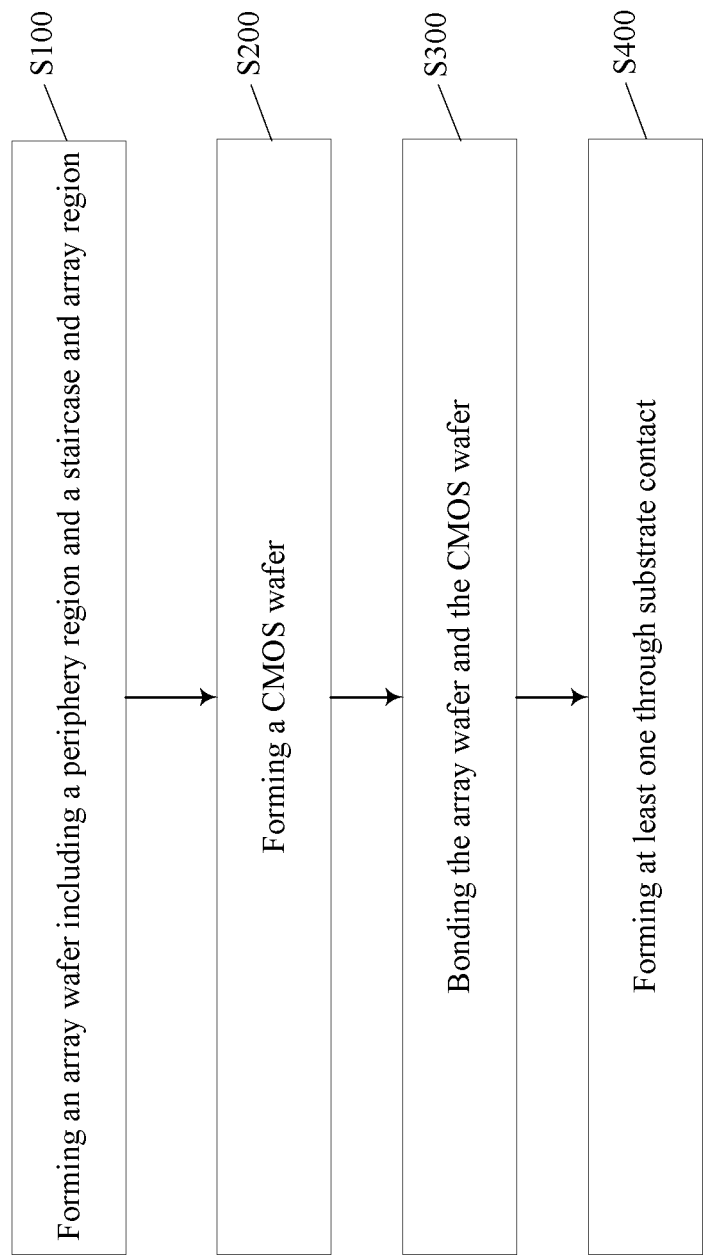

Embodiments of the present disclosure will be described with reference to the accompanying drawings.

DETAILED DESCRIPTION

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to effect such feature, structure or characteristic in connection with other embodiments whether or not explicitly described.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure, or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnection layer can include one or more conductor and contact layers (in which contacts, interconnect lines, and/or vias are formed) and one or more dielectric layers.

As used herein, the term "nominal/nominally" refers to a desired, or target, value of a characteristic or parameter for a component or a process operation, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

As used herein, the term "3D memory device" refers to a semiconductor device with vertically-oriented strings of memory cell transistors (i.e., region herein as "memory strings," such as NAND strings) on a laterally-oriented substrate so that the memory strings extend in the vertical direction with respect to the substrate. As used herein, the term "vertical/vertically" means nominally perpendicular to a lateral surface of a substrate.

As semiconductor technology advances, three-dimensional (3D) memory devices, such as 3D NAND memory devices, keep scaling more oxide/nitride (ON) layers. Generally, in some conventional methods for forming a 3D memory device, a complementary metal-oxide-semiconductor wafer ("CMOS wafer" hereinafter) is bonded with a memory cell array wafer ("array wafer" hereinafter) to form a framework of the 3D memory device. To form interconnect structures for providing vertical electrically interconnects between the stacked memory cell array devices and peripheral devices (e.g., for power bus and metal routing), a through silicon contact (TSC) etching process is performed to penetrate the entire silicon layer which has a large thickness due to the increased numbers of ON layers. As the etching hole has a substantial aspect ratio, it requires to a quantity of energy to perform a plasma etching process to form the TSC. Further, since the TSC etching process is performed after bonding the CMOS wafer and the memory cell array wafer, the plasma during the TSC etching process can go through multiple layers and damage the COMS devices, thus effecting the reliability of the CMOS devices.

Accordingly, a new 3D memory device and a fabricating method thereof are provided to address such issues. It is noted that, the 3D memory device can be a part of a non-monolithic 3D memory device, in which components (e.g., the CMOS devices and the memory cell array device) are formed separately on different wafers and then bonded in a face-to-face manner. In some embodiments, as described below in connection with FIGS. 1-9, the array device substrate is flipped and faces down towards the CMOS substrate for hybrid bonding, so that in the bonded non-monolithic 3D memory device, the array wafer is above the CMOS wafer. It is understood that in some other embodiments, the array wafer remains as the substrate of the bonded non-monolithic 3D memory device, and the CMOS wafer is flipped and faces down towards the array wafer for hybrid bonding.

Referring to FIGS. 1A-1E, flow diagrams of an exemplary method for forming a 3D memory device are illustrated in accordance to some embodiments of the present disclosure. It should be understood that the operations and/or steps shown in FIGS. 1A-1E are not exhaustive and that other operations can be performed as well before, after, or between any of the illustrated operations. FIGS. 2-9 illustrate schematic cross-sectional views of an exemplary 3D memory device at certain fabricating stages of the method shown in FIGS. 1A-1E according to some embodiments of the present disclosure.

As shown in FIG. 1A, the method starts at operation S100, in which an array wafer including a periphery region and a staircase and array region is formed. An etch stop layer and an array well structure can be formed in the periphery region, and an array device can be formed in the staircase and array region.

Figure 1B:
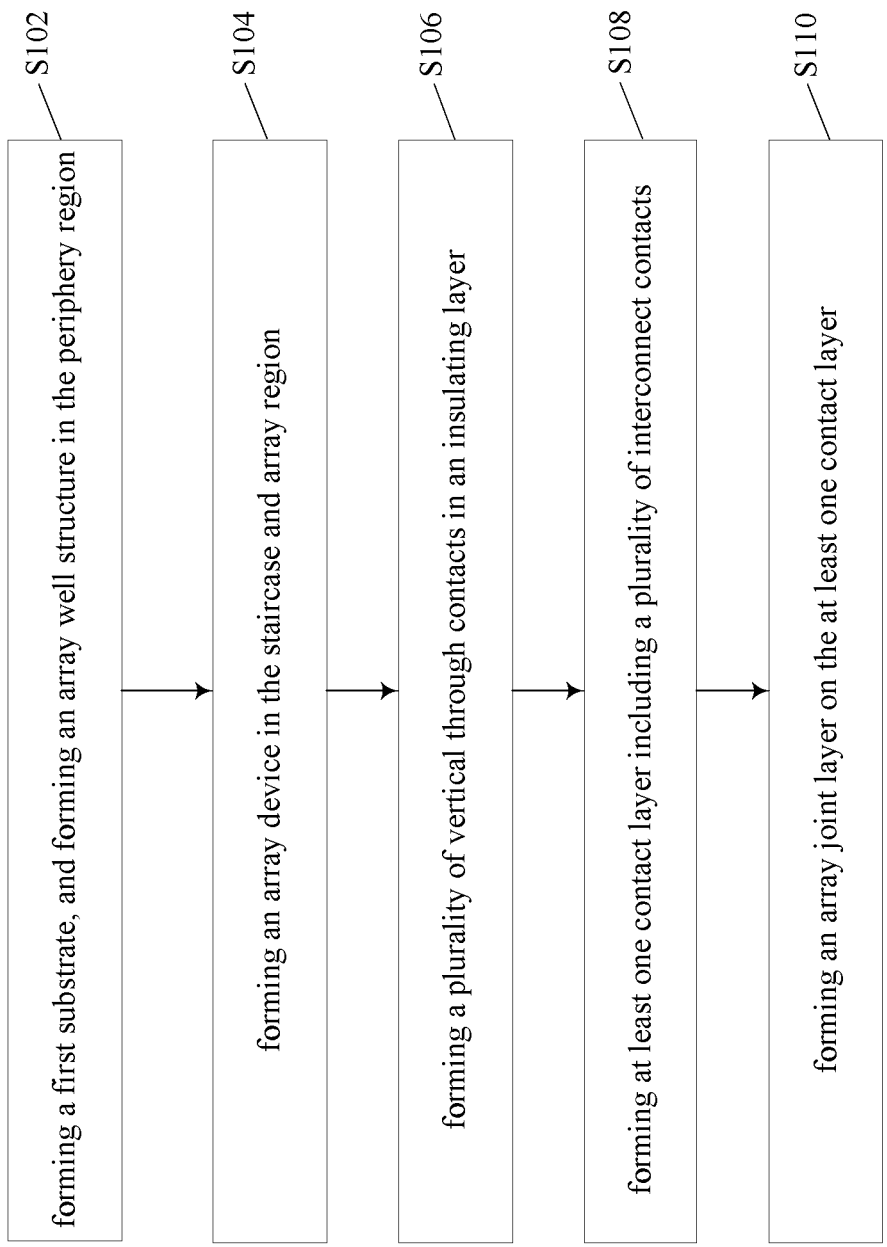
Figure 2:
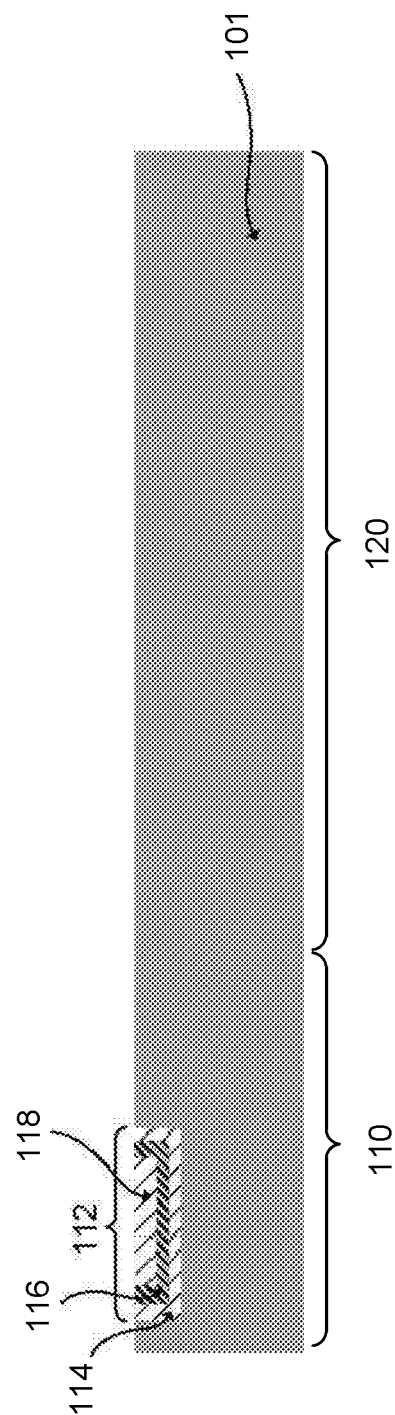
FIGS. 2-9 illustrate schematic cross-sectional views of an exemplary 3D memory device at certain fabricating stages of the method shown in FIGS. 1A-1E according to some embodiments of the present disclosure.

Referring to FIG. 1B and FIG. 2, operation S100 can include step S102 of forming a first substrate 101, and forming an array well structure 112 in the periphery region 110. In some embodiments, the first substrate 101 can include any suitable semiconductor material that can include silicon (e.g., monocrystalline silicon, polycrystalline silicon), silicon germanium (SiGe), gallium arsenide (GaAs), germanium (Ge), silicon on insulator (SOI), germanium on insulator (GOI), or any suitable combination thereof. In some embodiments, base substrate 540 is a thinned substrate (e.g., a semiconductor layer), which was thinned by grinding, wet/dry etching, chemical mechanical polishing (CMP), or any combination thereof. In some embodiments, the first substrate 101 can be a single layer substrate or a multi-layer substrate, for example, a monocrystalline single-layer substrate, a polycrystalline silicon (polysilicon) single-layer substrate, a polysilicon and metal multi-layer substrate, etc.

The first substrate 101 can include two lateral surfaces (e.g., a top surface and a bottom surface) extending laterally in the lateral direction. As used herein, whether one component (e.g., a layer or a device) is "on," "above," or "below" another component (e.g., a layer or a device) of a semiconductor device is determined relative to the substrate of the semiconductor device (e.g., first substrate 101) in the vertical direction when the substrate is positioned in the lowest plane of the semiconductor device in the vertical direction. The same notion for describing spatial relationship is applied throughout the present disclosure.

In accordance with some embodiments, as shown in FIG. 2, the first substrate 101 can include a periphery region 110 and a staircase and array region 120 both extending in the lateral direction. The array well structure 112 can be formed in the periphery region 110 of the first substrate 101.

The array well structure 112 can be a bipolar junction transistor that includes three well regions 114, 116, and 118. In some embodiments, the array well structure 112 can be a PNP type transistor. That is, a n-well region 116 is sandwiched by two p-well regions 114 and 118. In some other embodiments, the array well structure 112 can be a NPN type transistor. That is, a p-well region 116 is sandwiched by two n-well regions 114 and 118. The n-well region(s) and p-well region(s) 114, 116 and 118 can be formed by any suitable doping processes. The array well structure 112 can cover a portion of a top surface of the periphery region 110 of the first substrate 101.

Figure 3:
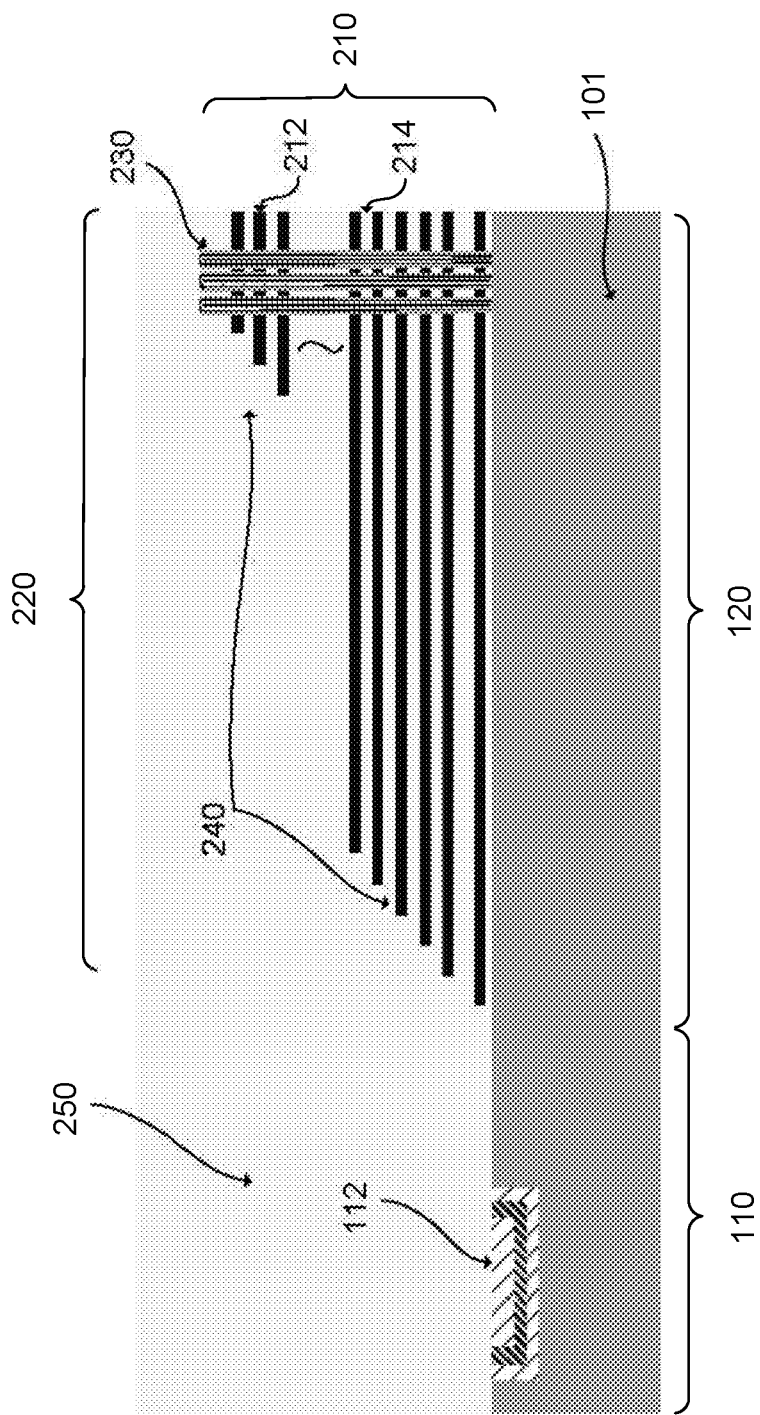

Referring to FIG. 1B and FIG. 3, operation S100 can further include step S104 of forming an array device 220 in the staircase and array region 120. In some embodiments, the array device 220 can be an NAND flash memory device in which memory cells are provided in the form of an array of NAND strings 230 extending vertically above first substrate 101. The array device 220 can include a plurality of NAND strings 230 that extend through a plurality of conductor layer 212 and dielectric layer 214 pairs. The plurality of conductor/dielectric layer pairs are also referred to herein as an "alternating conductor/dielectric stack" 210. The number of the conductor/dielectric layer pairs in alternating conductor/dielectric stack 210 (e.g., 32, 64, or 96) can set the number of memory cells in the array device 220. Conductor layers 212 and dielectric layers 214 in alternating conductor/dielectric stack 210 alternate in the vertical direction. In other words, except the ones at the top or bottom of alternating conductor/dielectric stack 210, each conductor layer 212 can be adjoined by two dielectric layers 214 on both sides, and each dielectric layer 214 can be adjoined by two conductor layers 212 on both sides. Conductor layers 212 can each have the same thickness or have different thicknesses. Similarly, dielectric layers 214 can each have the same thickness or have different thicknesses. Conductor layers 212 can include conductor materials including, but not limited to, tungsten (W), cobalt (Co), copper (Cu), aluminum (Al), polycrystalline silicon (polysilicon), doped silicon, silicides, or any combination thereof. Dielectric layers 214 can include dielectric materials including, but not limited to, silicon oxide, silicon nitride, silicon oxynitride, or any combination thereof. In some embodiments, conductor layers 212 include metal layers, such as W, and dielectric layers 214 include silicon oxide.

As shown in FIG. 3, at least on one side in the lateral direction, alternating conductor/dielectric stack 210 can include a staircase structure 240. Each level of staircase structure 240 can include one or more conductor/dielectric layer pairs, each including conductor layer 212 and dielectric layer 214. The top layer in each level of staircase structure 240 can be conductor layer 212 for interconnection in the vertical direction. In some embodiments, each two adjacent levels of staircase structure 240 are offset by a nominally same distance in the vertical direction and a nominally same distance in the lateral direction. For each two adjacent levels of staircase structure 240, the first level (and conductor layer and dielectric layer therein) that is closer to first substrate 101 can extend laterally further than the second level (and conductor layer and dielectric layer therein), thereby forming a "landing area" on the first level for interconnection in the vertical direction.

As shown in FIG. 3, each NAND string 230 can include a channel structure extending through alternating conductor/dielectric stack. The channel structure can include a channel hole filled with semiconductor materials (e.g., as a semiconductor channel) and dielectric materials (e.g., as a memory film). In some embodiments, the semiconductor channel includes silicon, such as amorphous silicon, polysilicon, or single crystalline silicon. In some embodiments, the memory film is a composite layer including a tunneling layer, a storage layer (also known as "charge trap/storage layer"), and a blocking layer. Each NAND string 230 can have a cylinder shape (e.g., a pillar shape). The semiconductor channel, the tunneling layer, the storage layer, and the blocking layer are arranged along a direction from the center toward the outer surface of the pillar in this order, according to some embodiments. The tunneling layer can include silicon oxide, silicon nitride, or any combination thereof. The storage layer can include silicon nitride, silicon oxynitride, silicon, or any combination thereof. The blocking layer can include silicon oxide, silicon nitride, high dielectric constant (high-k) dielectrics, or any combination thereof.

In some embodiments, NAND strings 230 include a plurality of control gates (each being part of a word line) for NAND strings 230. Conductor layer 212 in alternating conductor/dielectric stack 210 can function as a control gate for memory cells of NAND string 230. Conductor layer 212 can include multiple control gates for multiple NAND strings 230 and can extend laterally as a word line ending in staircase structure 240.

Figure 4:
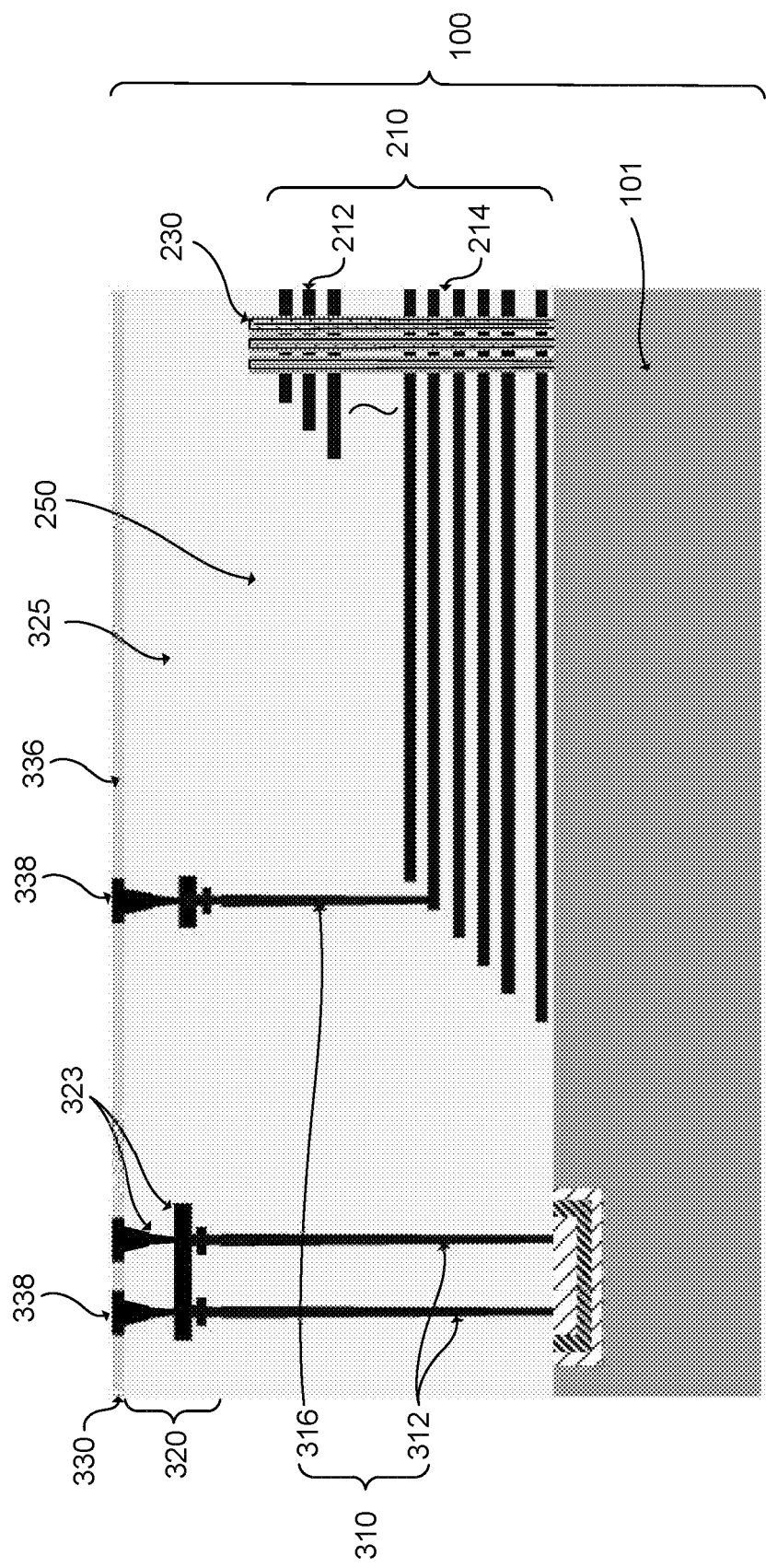

As shown in FIG. 1B and FIG. 4, operation S100 can further include step S106 of forming a plurality of vertical through contacts 310 in an insulating layer 250. In some embodiments as shown in FIG. 3, a deposition process can be performed to form the insulating layer 250, such that the insulating layer 250 can cover the array well structure 112, and the array device 220. A CMP process can be performed to planarize the top surface of the insulating layer 250. As shown in FIG. 4, the plurality of vertical through contacts 310 can be formed in the insulating layer 250, and can include at least one vertical contact 312 in contact with the array well structure 112, and multiple word line contacts 316 in contact with the word lines in staircase structure 240. Each vertical through contact 310 can include an opening (e.g., a via hole or a trench) filled with conductor materials including, but not limited to, W, Co, Cu, Al, silicides, or any combination thereof. Some or all of the plurality of vertical through contacts 310 can be formed simultaneously in a single contact forming process as described below in detail.

In some embodiments, an end (e.g., the upper end) of each vertical through contact 310 is flush with one another, e.g., on the top surface of the insulating layer 250 in which the vertical through contacts 310 are formed. Another end (e.g., the lower end) of each vertical through contact 310 can be in contact with the respective array wafer structure. For example, the lower end of the vertical contact 312 can be in contact with the array well structure 112, and the lower end of each word line contacts 316 can be in contact with corresponding conductor layer 206 (word line) in one level of staircase structure 240.

It is understood that, a contact forming process for forming the plurality of vertical through contacts 310 can include multiple processes, for example, photolithography, etching, thin film deposition, and CMP. For example, vertical through contacts 310 can be formed through insulating layer 250 by first deep etching vertical openings (e.g., by wet etching and/or dry etching), followed by filling the openings with conductor materials using Chemical Vapor Deposition (CVD), Physical Vapor Deposition (PVD), Atomic Layer Deposition (ALD), any other suitable processes, or any combination thereof. The conductor materials used for filling the vertical through contacts 310 can include, but are not limited to, W, Co, Cu, Al, polysilicon, silicides, or any combination thereof. In some embodiments, other conductor materials are also used to fill the openings to function as a barrier layer, an adhesion layer, and/or a seed layer.

In some embodiments, the plurality of vertical through contacts 310 including the vertical contacts 312 and the word line contacts 316, can be simultaneously formed in the same contact forming process. In some embodiments, each process in the contact forming process needs to be performed only once for the vertical contacts 312 and the word line contacts 316. For example, a single lithography process can be performed to pattern the masks for all the openings of the vertical contacts 312 and the word line contacts 316; a single etching process can be performed to etch all the openings of the vertical contacts 312 and the word line contacts 316; a single deposition process can be performed to fill all the openings of the vertical contacts 312 and the word line contacts 316 with the same conductor materials.

As shown in FIG. 1B and FIG. 4, operation S100 can further include step S108 of forming at least one contact layer 320 including a plurality of interconnect contacts 323. The contact layer 320 can include a dielectric layer 325 and interconnect contacts 323, and can be formed above the insulating layer 250. The upper end of each interconnect contact 323 can be flush with one another at the top surface of dielectric layer 325, and the lower end of each interconnect contact 323 can be flush with one another at the bottom surface of the dielectric layer 325, and can be in contact with the upper end of a corresponding vertical through contact 310, for example, the vertical contact 312 or the word line contact 316.

The dielectric layer 325 can be formed by one or more thin film deposition processes, such as ALD, CVD, PVD, any other suitable processes, or any combination thereof. Dielectric layer 325 can include dielectric materials, including, but not limited to, silicon oxide, silicon nitride, silicon oxynitride, or any combination thereof. The interconnect contacts 323 can be formed through dielectric layer 325 by first etching vertical openings (e.g., by wet etching and/or dry etching), followed by filling the openings with conductor materials using ALD, CVD, PVD, any other suitable processes, or any combination thereof. The conductor materials used to fill the interconnect contacts 323 can include, but are not limited to, W, Co, Cu, Al, polysilicon, silicides, or any combination thereof. In some embodiments, other conductor materials are used to fill the openings to function as a barrier layer, an adhesion layer, and/or a seed layer.

In some embodiments, the at least one contact layer 320 can include multiple layers, and each interconnect contact 323 can include multiple sub-contacts formed in the multiple layers. For example, as shown in FIG. 4, the multiple sub-contacts can include one or more contacts, single-layer/multi-layer vias, conductive lines, plugs, pads, and/or any other suitable conductive structures that are made by conductive materials including, but not limited to, W, Co, Cu, Al, doped silicon, silicides, or any combination thereof, and can be formed in multiple contact forming processes. For example, fabrication processes to form the multiple sub-contacts can include forming one or more conductive layers and one or more contact layer in the dielectric layer 325. The conductive layers and the conductor contact layers can be formed by any suitable known back-end-of-line (BEOL) methods. In some embodiments, all interconnect contacts 323 in contact layer 320 can be simultaneously formed in the same contact forming processes.

As shown in FIG. 1B and FIG. 4, operation S100 can further include step S110 of forming an array joint layer 330 on the at least one contact layer 320. The array joint layer 330 can be a back-end-of-line (BEOL) interconnection layer including one or more joint structures 338 embedded in a dielectric layer 336. The joint structures 338 can include, but not limited to, contacts, single-layer/multi-layer vias, conductive lines, plugs, pads, and/or any other suitable conductive structures that are made by conductive materials including, but not limited to, W, Co, Cu, Al, doped silicon, silicides, or any combination thereof. The dielectric layer 336 can include dielectric materials including, but not limited to, silicon oxide, silicon nitride, silicon oxynitride, or any combination thereof. One or more portions of the joint structures 338 can be exposed on the top surface of the array joint layer 330 on the array wafer 100.

In some embodiments, fabrication processes to form the array joint layer 330 include forming a dielectric layer 336, followed by forming a plurality of joint structures 338. One or more of the joint structures 338 can be in contact with the interconnect contacts 323 respectively. The dielectric layer 336 can include one or more layers of dielectric materials such as silicon oxide, silicon nitride, silicon oxynitride, or any combination thereof. The joint structures 338 can include, but not limited to, contacts, single-layer/multi-layer vias, conductive lines, plugs, pads, and/or any other suitable conductive structures that are made by conductive materials including, but not limited to, W, Co, Cu, Al, doped silicon, silicides, or any combination thereof.

In some embodiments, fabrication processes to form the joint structures 338 include forming openings in the dielectric layer 336, followed by filling the openings with conductive materials. The openings in the dielectric layer 336 can be filled with conductive materials by ALD, CVD, PVD, any other suitable processes, or any combination thereof. In some embodiments, fabrication processes to form the joint structures 338 further include forming one or more conductive layers and one or more contact layer in the dielectric layer. The conductive layers and the conductor contact layers can be formed by any suitable known BEOL methods.

Figure 5:
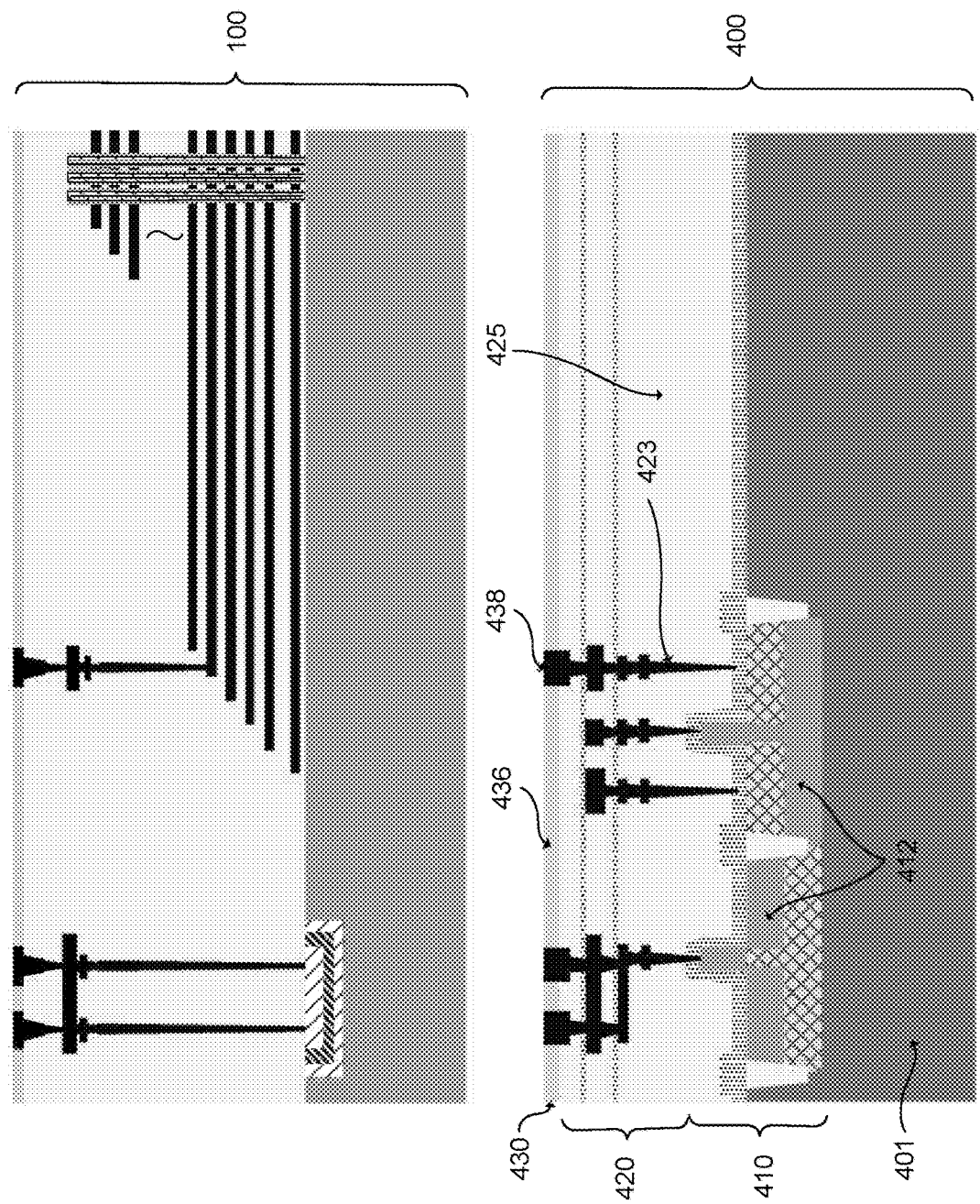

Referring back to FIG. 1, the method processed to operation S200, in which an CMOS wafer can be formed. As shown in FIG. 5, the CMOS wafer 400 can include a second substrate 401, a peripheral circuit layer 410 on the second substrate 401, at least one contact layer 420 on the CMOS device layer 410, and a CMOS joint layer 430 on the at least one contact layer 320.

As shown in FIG. 1C and FIG. 5, operation S200 can include step S202 of forming a second substrate 401, and forming a peripheral circuit layer 410 on the second substrate 401. In some embodiments, the second substrate 401 can include any suitable semiconductor material that can include silicon (e.g., monocrystalline silicon, polycrystalline silicon), silicon germanium (SiGe), gallium arsenide (GaAs), germanium (Ge), silicon on insulator (SOI), germanium on insulator (GOI), or any suitable combination thereof. Second substrate 510 can be a single layer substrate or a multi-layer substrate, for example, a monocrystalline single-layer substrate, a polycrystalline silicon (polysilicon) single-layer substrate, a polysilicon and metal multi-layer substrate, etc. In some embodiments, second substrate 401 is a thinned substrate (e.g., a semiconductive layer), which was thinned by grinding, wet/dry etching, chemical mechanical polishing (CMP), or any combination thereof.

The peripheral circuit layer 410 formed on the second substrate 401 can include one or more peripheral circuits including any suitable digital, analog, and/or mixed-signal peripheral circuits used for facilitating the operation of the 3D memory device. For example, the one or more peripheral circuits can include one or more of a page buffer, a decoder (e.g., a row decoder and a column decoder), a latch, a sense amplifier, a driver, a charge pump, a current or voltage reference, or any active or passive components of the circuits (e.g., transistors, diodes, resistors, or capacitors). In some embodiments as shown in FIG. 5, the one or more peripheral circuits can include multiple CMOS devices 412 formed using complementary metal-oxide-semiconductor (CMOS) technology.

As shown in FIG. 1C and FIG. 5, operation S200 can further include step S204 of forming at least one contact layer 420 including a plurality of interconnect contacts 423. The contact layer 420 can include a dielectric layer 425 and interconnect contacts 423, and can be formed above the peripheral circuit layer 410. The dielectric layer 425 can be formed by one or more thin film deposition processes, such as ALD, CVD, PVD, any other suitable processes, or any combination thereof. Dielectric layer 425 can include dielectric materials, including, but not limited to, silicon oxide, silicon nitride, silicon oxynitride, or any combination thereof. The interconnect contacts 423 can be formed through dielectric layer 425 by first etching vertical openings (e.g., by wet etching and/or dry etching), followed by filling the openings with conductor materials using ALD, CVD, PVD, any other suitable processes, or any combination thereof. The conductor materials used to fill the interconnect contacts 423 can include, but are not limited to, W, Co, Cu, Al, polysilicon, silicides, or any combination thereof. In some embodiments, other conductor materials are used to fill the openings to function as a barrier layer, an adhesion layer, and/or a seed layer.

In some embodiments, the at least one contact layer 420 can include multiple layers, and each interconnect contact 423 can include multiple sub-contacts formed in the multiple layers. For example, as shown in FIG. 5, the multiple sub-contacts can include one or more contacts, single-layer/multi-layer vias, conductive lines, plugs, pads, and/or any other suitable conductive structures that are made by conductive materials including, but not limited to, W, Co, Cu, Al, doped silicon, silicides, or any combination thereof, and can be formed in multiple contact forming processes. For example, fabrication processes to form the multiple sub-contacts can include forming one or more conductive layers and one or more contact layer in the dielectric layer 425. The conductive layers and the conductor contact layers can be formed by any suitable known front-end-of-line (FEOL) methods. In some embodiments, all interconnect contacts 423 in contact layer 420 can be simultaneously formed in the same contact forming processes.

As shown in FIG. 1C and FIG. 5, operation S200 can further include step S206 of forming an CMOS joint layer 430 on the at least one contact layer 420. The CMOS joint layer 330 can be a front-end-of-line (FEOL) interconnect layer including one or more joint structures 438 embedded in a dielectric layer 436. The joint structures 438 can include, but not limited to, contacts, single-layer/multi-layer vias, conductive lines, plugs, pads, and/or any other suitable conductive structures that are made by conductive materials including, but not limited to, W, Co, Cu, Al, doped silicon, silicides, or any combination thereof. The dielectric layer 436 can include dielectric materials including, but not limited to, silicon oxide, silicon nitride, silicon oxynitride, or any combination thereof. One or more portions of the joint structures 438 can be exposed on the top surface of the CMOS joint layer 430 on the CMOS wafer 400.

In some embodiments, fabrication processes to form the CMOS joint layer 430 include forming a dielectric layer 436, followed by forming a plurality of joint structures 438. One or more of the joint structures 438 can be in contact with the interconnect contacts 423 respectively. The dielectric layer 436 can include one or more layers of dielectric materials such as silicon oxide, silicon nitride, silicon oxynitride, or any combination thereof. The joint structures 438 can include, but not limited to, contacts, single-layer/multi-layer vias, conductive lines, plugs, pads, and/or any other suitable conductive structures that are made by conductive materials including, but not limited to, W, Co, Cu, Al, doped silicon, silicides, or any combination thereof.

In some embodiments, fabrication processes to form the joint structures 438 include forming openings in the dielectric layer 436, followed by filling the openings with conductive materials. The openings in the dielectric layer 436 can be filled with conductive materials by ALD, CVD, PVD, any other suitable processes, or any combination thereof. In some embodiments, fabrication processes to form the joint structures 438 further include forming one or more conductive layers and one or more contact layer in the dielectric layer. The conductive layers and the conductor contact layers can be formed by any suitable known FEOL methods.

Figure 6:
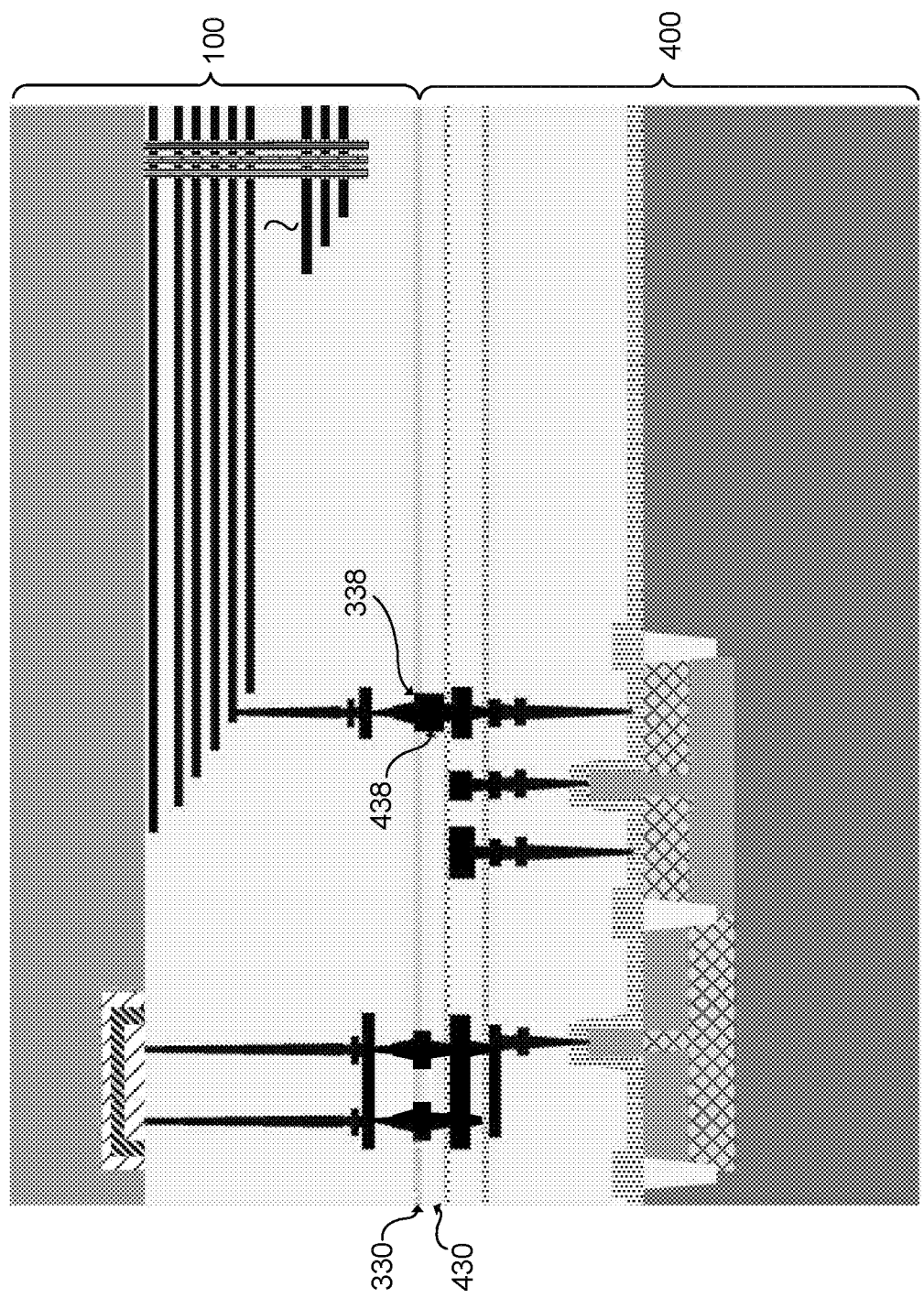

Referring back to FIG. 1A, the method processed to operation S300, in which the array wafer and the CMOS wafer can be bonded. As shown in FIG. 1D and FIG. 6, operation S300 can include step S302 of flipping over the array wafer 100 to face down towards the CMOS wafer 400 for hybrid bonding, and step S304 of bonding the array joint layer 330 of the array wafer 100 to the CMOS joint layer 430 of the CMOS wafer 400.

The bonding interface is between the array joint layer 330 and the CMOS joint layer 430. Therefore, the bonding interface includes both the interface between two dielectric layers (e.g., between a silicon nitride layer and a silicon oxide layer) and the interface between two conductive layers (e.g., between two metal layers). In some embodiments, one or more joint structures 338 in the array wafer 100 and one or more joint structures 438 in the CMOS wafer 400 can be contacted with each other at bonding interface for electrical connection.

In some embodiments, the hybrid bonding between the array wafer 100 and the CMOS wafer 400 can include any suitable bonding processes or combinations thereof. For example, the bonding interface can be formed by chemical bonds between the dielectric layers and/or the conductive layers on both sides of the bonding interface. As another example, the bonding interface can be formed by physical interaction (e.g., inter-diffusion) between the dielectric layers and/or the conductive layers on both sides of the bonding interface. In some embodiments, the bonding interface can be formed after a plasma treatment or a thermal treatment of the surfaces from both sides of the bonding interface prior to the bonding process.

Referring back to FIG. 1A, the method processed to operation S400, in which at least one through substrate contact can be formed to penetrate the first substrate and the array well structure to connect with the at least one vertical contact.

Figure 1E:
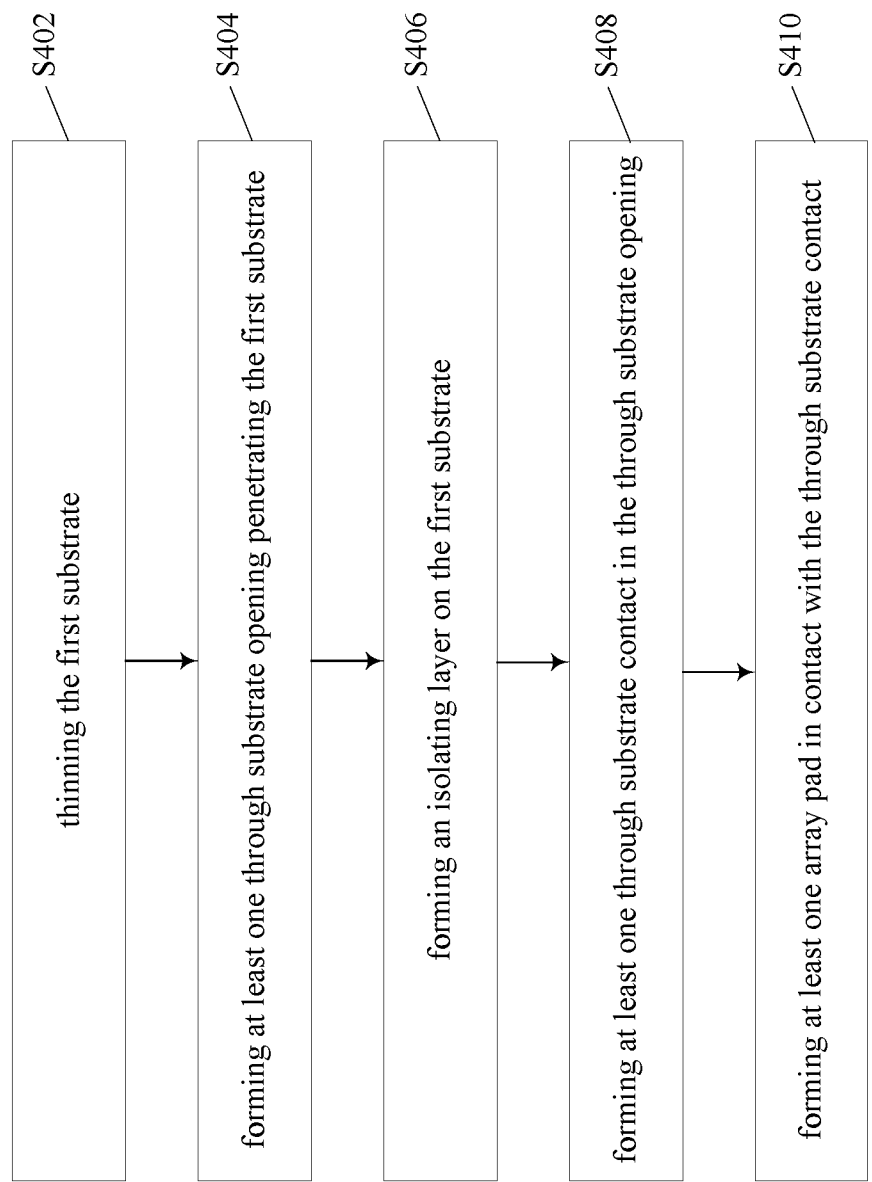

As shown in FIG. 1E, operation S400 can include step S402 of thinning the first substrate. In some embodiments, the first substrate 101 can be thinned by processes including, but not limited to, wafer grinding, dry etch, wet etch, CMP, any other suitable processes, or any combination thereof.

Figure 7:
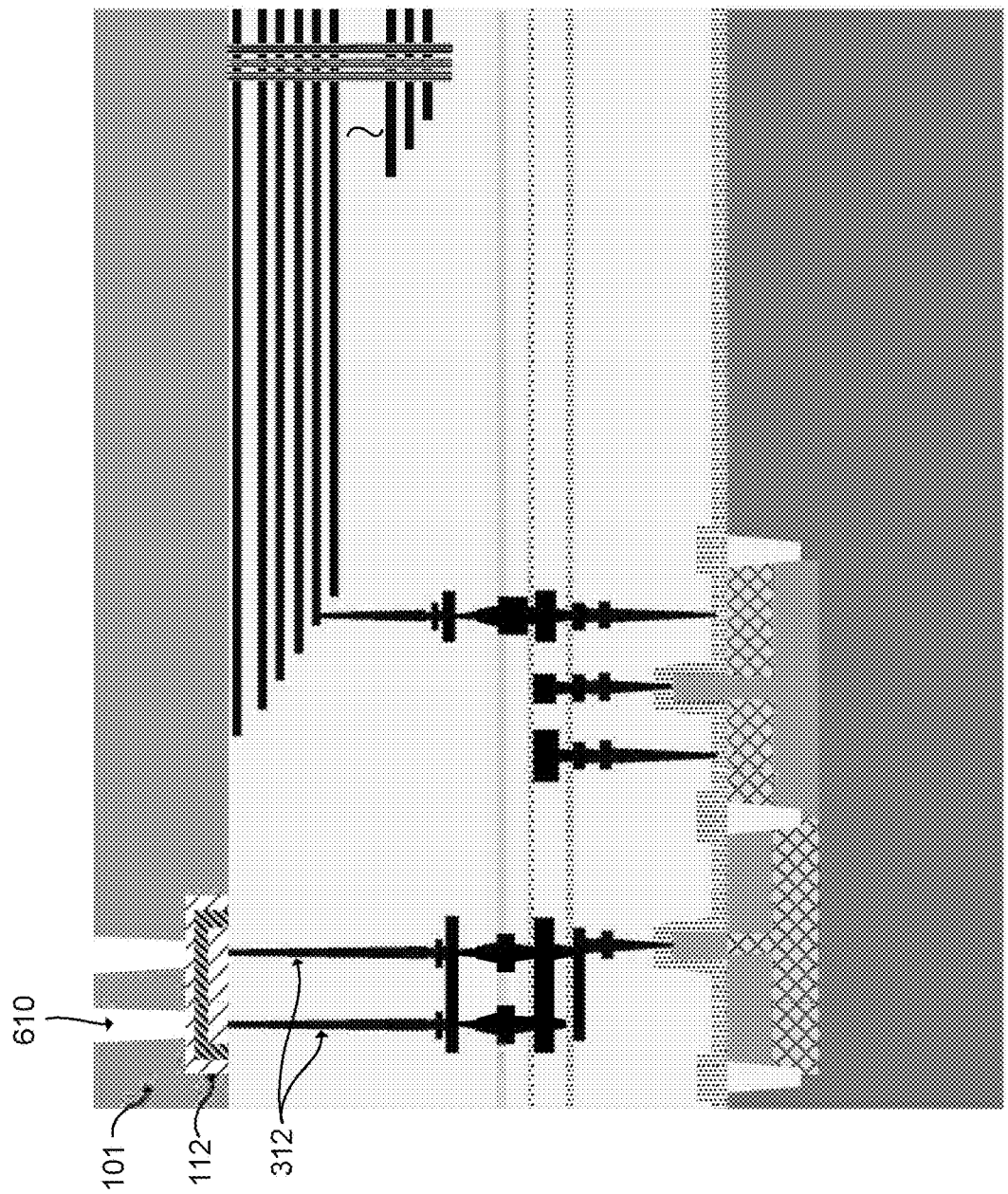

As shown in FIG. 1E and FIG. 7, operation S400 can include step S404 of forming at least one through substrate opening 610 that penetrates the first substrate 101. It is understood that, the at least one through substrate opening 610 can be formed by any suitable photolithography process. For example, a hard mask can be formed on the first substrate 101, and a deep plasma etching (e.g., deep reactive-ion etching process) can be performed to form the at least one through substrate opening 610 penetrating the entire substrate 101 and stopped at the array well structure 112.

It is noted that, during the plasma etching process, a high-energy stream of glow discharge (plasma) of an appropriate gas mixture being shot (in pulses) at a sample. The plasma source (also referred as "etch species") can be either charged (ions) or neutral (atoms and radicals). During the plasma etching process, the plasma generates volatile etch products from the chemical reactions between the substrate 101 and the reactive species generated by the plasma. It is also understood that, during the plasma etching process, the high-energy stream of plasma is blocked by the array well structure 112, and thus cannot go through the at least one vertical contact to affect the CMOS devices in the CMOS wafer 400. Therefore, the potential plasma-induced damage (PID) to the CMOS devices in the CMOS wafer 400 can be avoided.

Figure 8:
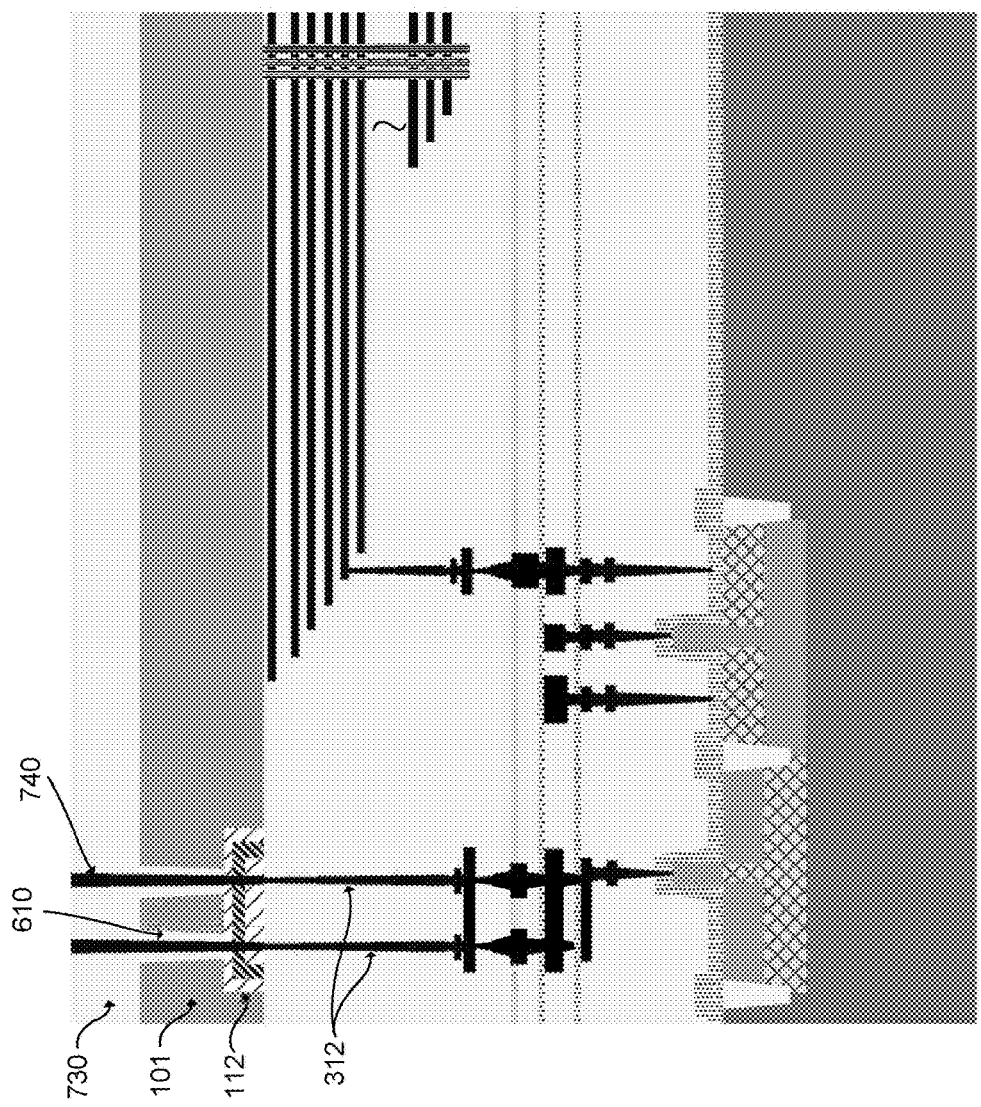

As shown in FIG. 1E and FIG. 8, operation S400 can further include step S406 of forming an isolating layer 730 covering the first substrate 101 and filling the at least one through substrate opening 610. The isolating layer 730 can include dielectric materials including, but not limited to, silicon oxide, silicon nitride, silicon oxynitride, or any combination thereof.

As shown in FIG. 1E and FIG. 8, operation S400 can further include step S408 of forming at least one through substrate contact 740 (also referred as "through silicon contact (TSC)" in some embodiments) that penetrates the isolating layer 730 and the array well structure 112, and in contact with the at least one vertical contact 312. It is understood that, a contact process for forming the at least one through substrate contact 740 can include multiple processes, for example, photolithography, etching, thin film deposition, and CMP. In some embodiments, at least one vertical through opening can be formed through corresponding through substrate opening 610 by a wet etching and/or dry etching to penetrate the isolating layer 730 and the array well structure 112. As such, the end surface of the at least one vertical contact 312 that are landed at the array well structure 112 can be exposed by the at least one vertical through opening. A followed deposition process can form the at least one through substrate contact 740 by filling the at least one vertical through opening with conductor materials using ALD, CVD, PVD, any other suitable processes, or any combination thereof. The conductor materials used for filling the at least one through substrate contact 740 can include, but are not limited to, W, Co, Cu, Al, polysilicon, silicides, or any combination thereof. In some embodiments, other conductor materials are also used to fill the openings to function as a barrier layer, an adhesion layer, and/or a seed layer.

Figure 9:
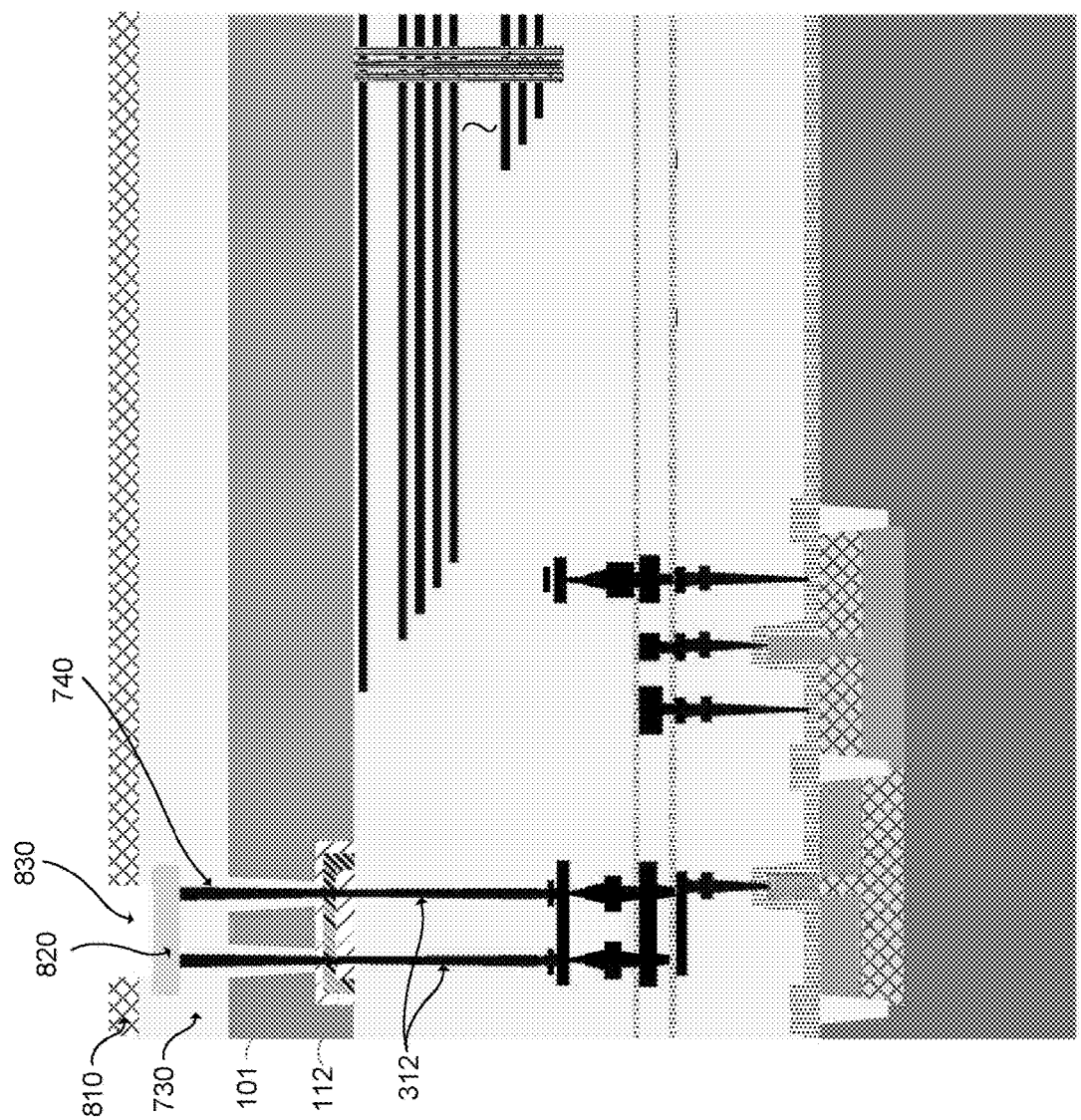

As shown in FIG. 1E and FIG. 9, operation S400 can further include step S410 of forming at least one array pad 820 in contact with the least one through substrate contact 740. It is understood that, a contact process for forming the at least one array pad 820 can include multiple processes, for example, photolithography, etching, thin film deposition, and CMP. In some embodiments, a hard mask layer can be formed on the isolating layer 730, and at least one vertical through opening can be formed in the isolating layer 730 by a wet etching and/or dry etching by using the hard mask layer. As such, the end surface of the least one through substrate contact 740 can be exposed by the at least one vertical through opening. A followed deposition process can form at least one array pad 820 by filling the at least one vertical through opening with conductor materials using ALD, CVD, PVD, any other suitable processes, or any combination thereof. The conductor materials used for filling the at least one array pad 820 can include, but are not limited to, W, Co, Cu, Al, polysilicon, silicides, or any combination thereof. In some embodiments, other conductor materials are also used to fill the openings to function as a barrier layer, an adhesion layer, and/or a seed layer. A protecting layer 810 can be formed on the isolating layer 730, and at least one pad opening 830 can be formed to expose the at least one array pad 820.

By using the at least one array pad 820 on the back side of the first substrate, rather than the surrounding regions of the first substrate, the periphery circuits of the 3D memory device can be connected out through the back side of the 3D memory device. Thus, the size of the 3D memory device can be reduced and the integration degree of the 3D memory device can be increased. Further, the risk of plasma-induced damage (PID) to the CMOS devices can be eliminated by using the etch stop layer and the array well structure to block plasma during forming the vertical through contacts, thereby increasing the CMOS device.

Accordingly, a 3D memory device and a fabricating method thereof are provided. In some embodiments, the method can include forming an array wafer including a periphery region and a staircase and array region, comprising: forming an array well structure in a first substrate in the periphery region, forming an array device on the first substrate in the staircase and array region, and forming at least one vertical through contact in the periphery region and in contact with the array well structure. The method can further include: forming a CMOS wafer; bonding the array wafer and the CMOS wafer; and forming at least one through substrate contact penetrating the first substrate and the array well structure, and in contact with the at least one vertical through contact.

In some embodiments, forming the array well structure comprises: forming a bipolar junction transistor in the first substrate in the periphery region; wherein the bipolar junction transistor includes a n-well region sandwiched by two p-well regions.

In some embodiments, forming the array well structure comprises: forming a bipolar junction transistor in the first substrate in the periphery region; wherein the bipolar junction transistor includes a p-well region sandwiched by two n-well regions.

In some embodiments, forming the array device comprises: forming an alternating conductor/dielectric stack on the first substrate; forming a plurality of NAND strings vertically penetrating the alternating conductor/dielectric stack; and forming a staircase structure on at least one lateral side of the alternating conductor/dielectric stack.

In some embodiments, forming the array wafer further comprises: forming an insulating layer covering the array well structure and the array device; and forming at least one word line contact in the staircase and array region and in contact with a word line in the staircase structure; wherein the at least one vertical through contact and the at least one word line contact are simultaneously formed in the insulating layer by a same contact forming process.

In some embodiments, forming the array wafer further comprises: forming at least one first contact layer including a plurality of first interconnect contacts on the insulating layer; and forming an array joint layer on the at least one first contact layer.

In some embodiments, forming the CMOS wafer comprises: forming a peripheral circuit layer on a second substrate; forming at least one second contact layer including a plurality of second interconnect contacts on the peripheral circuit layer; and forming a CMOS joint layer on the at least one second contact layer.

In some embodiments, bonding the array wafer to the CMOS wafer comprises: flipping over the array wafer to face down towards the CMOS wafer; and bonding the array joint layer of the array wafer to the CMOS joint layer of the CMOS wafer, such that the at least one vertical through contact is electrically connected to the peripheral circuit layer through at least one first interconnect contact and at least one second interconnect contact.

In some embodiments, forming the at least one through substrate contact comprises: forming at least one through substrate opening penetrating the first substrate; and forming an isolating layer covering the first substrate and filling the at least one through substrate opening; forming at least one vertical through opening that penetrates the isolating layer, the at least one through substrate opening, and the array well structure, and exposes at least a portion of the at least one vertical through contact; and forming the at least one through substrate contact in the at least one vertical through opening, such that the at least one through substrate contact is in contact with the at least one vertical contact.

In some embodiments, forming at least one through substrate opening comprises: using a deep plasma etching to form the at least one through substrate opening in the first substrate; wherein a high-energy stream of plasma during the deep plasma etching is blocked by the array well structure.

In some embodiments, forming the at least one through substrate contact further comprises: forming at least one array pad in contact with the least one through substrate contact; and forming at least one pad opening to expose the at least one array pad.

The disclosed three-dimensional (3D) memory device can comprises an array wafer including a periphery region and a staircase and array region, comprising: a first substrate, an array well structure in the first substrate in the periphery region, an array device on the first substrate in the staircase and array region, at least one vertical through contact in the periphery region; and at least one through substrate contact penetrating the first substrate and the array well structure, and in contact with the at least one vertical through contact. The 3D memory device can further comprise a CMOS wafer bonded on the array wafer, comprising a peripheral circuit layer electrically connected to the at least one through substrate contact through the at least one vertical through contact.

In some embodiments, the array well structure comprises a bipolar junction transistor including a p-well region sandwiched by two n-well regions in the first substrate.

In some embodiments, the array well structure comprises a bipolar junction transistor including a n-well region sandwiched by two p-well regions in the first substrate.

In some embodiments, the array device comprises: an alternating conductor/dielectric stack on the first substrate; a plurality of NAND strings vertically penetrating the alternating conductor/dielectric stack; and a staircase structure on at least one lateral side of the alternating conductor/dielectric stack.

In some embodiments, the array wafer further comprises: an insulating layer covering the array well structure and the array device; at least one word line contact in the staircase and array region and in contact with a word line in the staircase structure; wherein the at least one vertical through contact and the at least one word line contact penetrate the insulating layer.

In some embodiments, the array wafer further comprises: at least one first contact layer including a plurality of first interconnect contacts covering the insulating layer; and an array joint layer between the at least one first contact layer and the CMOS wafer.

In some embodiments, the CMOS wafer comprises: a peripheral circuit layer on a second substrate; at least one second contact layer including a plurality of second interconnect contacts on the peripheral circuit layer; and a CMOS joint layer between the at least one second contact layer and the array joint layer.

In some embodiments, the array wafer further comprises: an isolating layer covering the first substrate; wherein the at least one through substrate contact penetrates the isolating layer and the array well structure, and in contact with the at least one vertical contact.

In some embodiments, the array wafer further comprises: at least one array pad in contact with the least one through substrate contact; wherein the at least one array pad is electrically connected to the peripheral circuit layer of the CMOS wafer through the at least one vertical through contact, the at least one first interconnect contact, and the at least one second interconnect contact.

Other aspects of the present disclosure can be understood by those skilled in the art in light of the description, the claims, and the drawings of the present disclosure.

The foregoing description of the specific embodiments will so fully reveal the general nature of the present disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections may set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:

1. A method for forming a three-dimensional (3D) memory device, comprising:
    forming an array wafer including a periphery region and a staircase and array region, comprising:
        forming an array well structure in a first substrate in the periphery region,
        forming an array device on the first substrate in the staircase and array region, and
        forming at least one vertical through contact in the periphery region and in contact with the array well structure;
    forming a CMOS wafer;
    bonding the array wafer and the CMOS wafer; and
    forming at least one through substrate contact penetrating the first substrate and the array well structure, and in contact with the at least one vertical through contact.

2. The method of claim 1, wherein forming the array well structure comprises:
    forming a bipolar junction transistor in the first substrate in the periphery region;
    wherein the bipolar junction transistor includes an n-well region sandwiched by two p-well regions.

3. The method of claim 1, wherein forming the array well structure comprises:
    forming a bipolar junction transistor in the first substrate in the periphery region;
    wherein the bipolar junction transistor includes a p-well region sandwiched by two n-well regions.

4. The method of claim 1, wherein forming the array device comprises:
  forming an alternating conductor/dielectric stack on the first substrate;
  forming a plurality of NAND strings vertically penetrating the alternating conductor/dielectric stack; and
  forming a staircase structure on at least one lateral side of the alternating conductor/dielectric stack.

5. The method of claim 4, wherein forming the array wafer further comprises:
  forming an insulating layer covering the array well structure and the array device; and
  forming at least one word line contact in the staircase and array region and in contact with a word line in the staircase structure;
  wherein the at least one vertical through contact and the at least one word line contact are simultaneously formed in the insulating layer by a same contact forming process.

6. The method of claim 5, wherein forming the array wafer further comprises:
  forming at least one first contact layer including a plurality of first interconnect contacts on the insulating layer; and
  forming an array joint layer on the at least one first contact layer.

7. The method of claim 6, wherein forming the CMOS wafer comprises:
  forming a peripheral circuit layer on a second substrate;
  forming at least one second contact layer including a plurality of second interconnect contacts on the peripheral circuit layer; and
  forming a CMOS joint layer on the at least one second contact layer.

8. The method of claim 7, wherein bonding the array wafer to the CMOS wafer comprises:
  flipping over the array wafer to face down towards the CMOS wafer; and
  bonding the array joint layer of the array wafer to the CMOS joint layer of the CMOS wafer, such that the at least one vertical through contact is electrically connected to the peripheral circuit layer through at least one first interconnect contact and at least one second interconnect contact.

9. The method of claim 8, wherein forming the at least one through substrate contact comprises:
  forming at least one through substrate opening penetrating the first substrate; and
  forming an isolating layer covering the first substrate and filling the at least one through substrate opening;
  forming at least one vertical through opening that penetrates the isolating layer, the at least one through substrate opening, and the array well structure, and exposes at least a portion of the at least one vertical through contact; and
  forming the at least one through substrate contact in the at least one vertical through opening, such that the at least one through substrate contact is in contact with the at least one vertical contact.

10. The method of claim 9, wherein forming at least one through substrate opening comprises:
  using a deep plasma etching to form the at least one through substrate opening in the first substrate;
  wherein a high-energy stream of plasma during the deep plasma etching is blocked by the array well structure.

11. The method of claim 10, wherein forming the at least one through substrate contact further comprises:
  forming at least one array pad in contact with the least one through substrate contact; and
  forming at least one pad opening to expose the at least one array pad.

12. A three-dimensional (3D) memory device, comprising:
  an array wafer including a periphery region and a staircase and array region, comprising:
    a first substrate,
    an array well structure in the first substrate in the periphery region,
    an array device on the first substrate in the staircase and array region,
    at least one vertical through contact in the periphery region and corresponding to the array well structure; and
    at least one through substrate contact penetrating the first substrate and the array well structure, and in contact with the at least one vertical through contact; and
  a CMOS wafer bonded on the array wafer, comprising a peripheral circuit layer electrically connected to the at least one through substrate contact through the at least one vertical through contact.

13. The 3D memory device of claim 12, wherein the array well structure comprises:
  a bipolar junction transistor including a p-well region sandwiched by two n-well regions in the first substrate.

14. The 3D memory device of claim 12, wherein the array well structure comprises:
  a bipolar junction transistor including an n-well region sandwiched by two p-well regions in the first substrate.

15. The 3D memory device of claim 12, wherein the array device comprises:
  an alternating conductor/dielectric stack on the first substrate;
  a plurality of NAND strings vertically penetrating the alternating conductor/dielectric stack; and
  a staircase structure on at least one lateral side of the alternating conductor/dielectric stack.

16. The 3D memory device of claim 15, wherein the array wafer further comprises:
  an insulating layer covering the array well structure and the array device;
  at least one word line contact in the staircase and array region and in contact with a word line in the staircase structure;
  wherein the at least one vertical through contact and the at least one word line contact penetrate the insulating layer.

17. The 3D memory device of claim 16, wherein the array wafer further comprises:
  at least one first contact layer including a plurality of first interconnect contacts covering the insulating layer; and
  an array joint layer between the at least one first contact layer and the CMOS wafer.

18. The 3D memory device of claim 17, wherein the CMOS wafer comprises:
  a peripheral circuit layer on a second substrate;
  at least one second contact layer including a plurality of second interconnect contacts on the peripheral circuit layer; and
  a CMOS joint layer between the at least one second contact layer and the array joint layer.

19. The 3D memory device of claim 18, wherein the array wafer further comprises:
  an isolating layer covering the first substrate;

wherein the at least one through substrate contact penetrates the isolating layer and the array well structure, and in contact with the at least one vertical contact.

20. The 3D memory device of claim 19, wherein the array wafer further comprises:
at least one array pad in contact with the least one through substrate contact;
wherein the at least one array pad is electrically connected to the peripheral circuit layer of the CMOS wafer through the at least one vertical through contact, the at least one first interconnect contact, and the at least one second interconnect contact.

* * * * *